(12) United States Patent
Wu

(10) Patent No.: US 11,244,933 B2
(45) Date of Patent: Feb. 8, 2022

(54) MODULARIZED SPLICED LED DISPLAY SCREEN

(71) Applicant: Shenzhen Chip Optech Co. Ltd., Shenzhen (CN)

(72) Inventor: XiaoGang Wu, Shenzhen (CN)

(73) Assignee: Shenzhen Chip Optech Co. Ltd., Shenzhen (CN)

( * ) Notice: Subject to any disclaimer, the term of this patent is extended or adjusted under 35 U.S.C. 154(b) by 270 days.

(21) Appl. No.: 16/737,268

(22) Filed: Jan. 8, 2020

(65) Prior Publication Data
US 2021/0005783 A1    Jan. 7, 2021

(30) Foreign Application Priority Data
Jul. 4, 2019 (CN) .......................... 201910597100.X

(51) Int. Cl.
| | |
|---|---|
| *H01L 33/24* | (2010.01) |
| *H01L 25/075* | (2006.01) |
| *G09G 3/32* | (2016.01) |
| *H01L 33/62* | (2010.01) |
| *H01L 25/07* | (2006.01) |
| *G09F 9/33* | (2006.01) |
| *G09F 9/302* | (2006.01) |

(Continued)

(52) U.S. Cl.
CPC ........ *H01L 25/0753* (2013.01); *G06F 3/1446* (2013.01); *G09F 9/3026* (2013.01); *G09F 9/33* (2013.01); *G09F 13/0413* (2013.01); *G09G 3/32* (2013.01); *H01L 25/073* (2013.01); *H01L 33/24* (2013.01); *H01L 33/62* (2013.01); *G09F 9/3023* (2013.01)

(58) Field of Classification Search
CPC ... H01L 25/0753; H01L 25/073; H01L 33/24; H01L 33/62; G06F 3/1446; G09F 9/3026; G09F 9/33; G09F 13/0413; G09F 9/3023; G09G 3/32
See application file for complete search history.

(56) References Cited

U.S. PATENT DOCUMENTS

| | | | | |
|---|---|---|---|---|
| 2014/0085864 | A1* | 3/2014 | Wu | ........................ F21V 19/001 362/97.1 |
| 2014/0198251 | A1* | 7/2014 | Li | ........................... H04N 9/12 348/453 |

(Continued)

FOREIGN PATENT DOCUMENTS

| | | | | |
|---|---|---|---|---|
| CA | 2979012 | A1 * | 2/2013 | ........... G06F 1/1626 |
| CN | 109654353 | A * | 4/2019 | |

(Continued)

*Primary Examiner* — Tracie Y Green
(74) *Attorney, Agent, or Firm* — Novoclaims Patent Services LLC; Mei Lin Wong

(57) ABSTRACT

The present invention relates to a modularized spliced LED display screen including a plurality of unit screens. When assembling, a certain number of the unit screens are assembled in a splicing frame to form a module screen. A number of the said module screens are assembled horizontally to form a large display screen. The present invention forms a module screen by a plurality of unit screens of the same structure, and then assembles a plurality of module screens horizontally to form a large display screen, and the overall assembly method is simple, and is easy to assemble and disassemble.

9 Claims, 11 Drawing Sheets

(51) Int. Cl.
*G06F 3/14* (2006.01)
*G09F 13/04* (2006.01)

(56) References Cited

U.S. PATENT DOCUMENTS

2020/0182439 A1* 6/2020 Wu .................. F21K 9/235
2021/0005798 A1* 1/2021 Wu .................. G09F 9/33

FOREIGN PATENT DOCUMENTS

CN 110211510 A * 9/2019
EP 2037438 A1 * 3/2009 ........... G09F 9/3026

* cited by examiner

MODULARIZED SPLICED LED DISPLAY SCREEN

BACKGROUND OF THE PRESENT INVENTION

Field of Invention

The invention relates to an LED display screen, in particular to a modularized spliced display screen which is convenient for splicing and disassembling, and comprises a plurality of unit screens. When assembling, a certain number of the unit screens are assembled in a splicing frame to form a module screen. A number of the said module screens are assembled horizontally to form a large display screen.

Description of Related Arts

The LED display screen is a flat panel display, which is composed of a plurality of small LED module panels, which is a device for displaying different information such as text, images, video, and video signals.

At present, LED display screens have been widely used in many fields such as outdoor advertising display and production image display.

In the specific use, the staff will generally assemble several small LED displays together to form a large overall display to display text, images, video and other information. This large overall display can increase the size of the display and then can improve display and display effects.

As shown in FIG. 1, it is a front view of a large overall display screen which is formed by splicing a plurality of small LED display screens 1.

As shown in FIG. 2, each of the small LED display screens 1 includes an outer frame 2, a plurality of modules 3, a power supply box 4, and a connection lock 5. The said plurality of the modules 3 are mounted on the outer frame 2. The power box 4 is connected to the back of the small LED display 1, and is used for setting electronic components such as an IC and a PCB. The connection lock 5 is disposed on the outer frame 2 to fix the adjacent small LED display 1 is together.

The above conventional small LED display has the following disadvantages in use.

First, each small LED display needs to be separately configured with the outer frame 2 and the power supply box 4 to display, and the overall structure of which is very complicated.

Second, each small LED display needs to be separately configured with the connection lock 5 to enable the assembly between the displays.

Third, because each small LED display has an independent power supply box 4, after the assembly is completed, it is necessary to connect the different power supply boxes 4 by the external line 6 (power supply line, signal line) to complete the overall power supply and the signal connection. The arrangement of lines is extremely complicated, and the connection work is very complicated.

SUMMARY OF THE PRESENT INVENTION

The present invention provides a modularized spliced LED display screen, which forms a module screen by a plurality of unit screens of the same structure, and then assembles a plurality of module screens horizontally to form a large display screen, and the overall assembly method is simple, and is easy to assemble and disassemble. This is the main object of the present invention.

The present invention provides a modularized spliced LED display screen. The power control module and the signal control module of a plurality of unit screens are all provided in a collective power supply box of a module screen, which can greatly simplify a single unit screen, and realizes the centralized setting and heat dissipation processing of circuits and electronic components. This is another object of the present invention.

The present invention provides a modular spliced LED display screen. The invention connects the assembled power supply boxes of different module screens by introducing cables and drawing cables, which can greatly simplify the connection structure and greatly reduce the difficulty of assembly and connection. This is another object of the present invention.

DETAILED DESCRIPTION OF THE PREFERRED EMBODIMENT

As shown in FIGS. 3 to 7, a modularized spliced LED display screen includes a plurality of unit screens 100.

Figure 4:
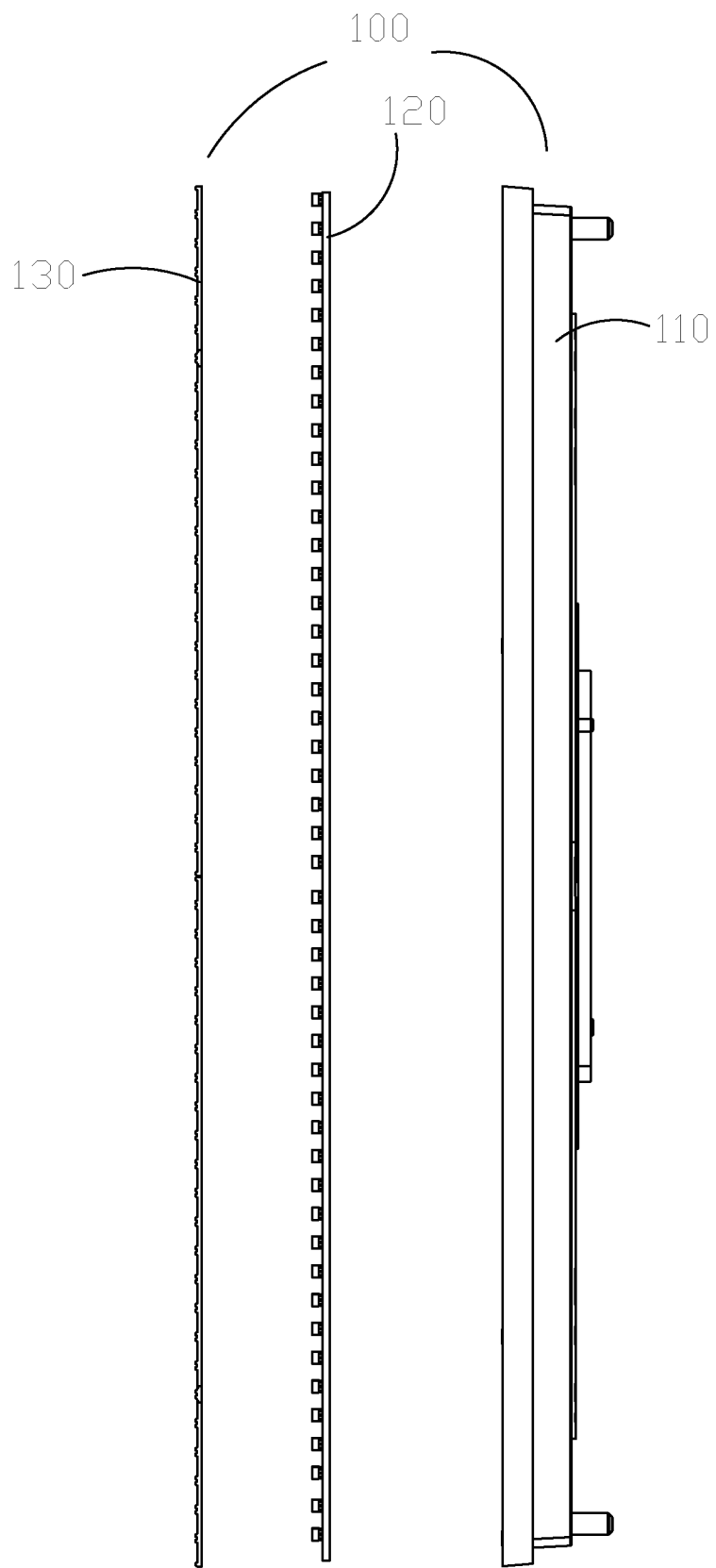
FIG. 4 is a schematic view of a unit screen of the present invention.

As shown in FIG. 4, each unit screens 100 includes a plate bottom plate 110, an LED light board 120, and a mask 130.

The bottom plate 110, the LED light board 120 and the mask 130 are all in a plate shape. The LED light board 120 is fixed on the plate bottom plate 110. The mask 130 is disposed in front of the LED light board 120. The unit screen 100 as a whole is flat.

Figure 1:
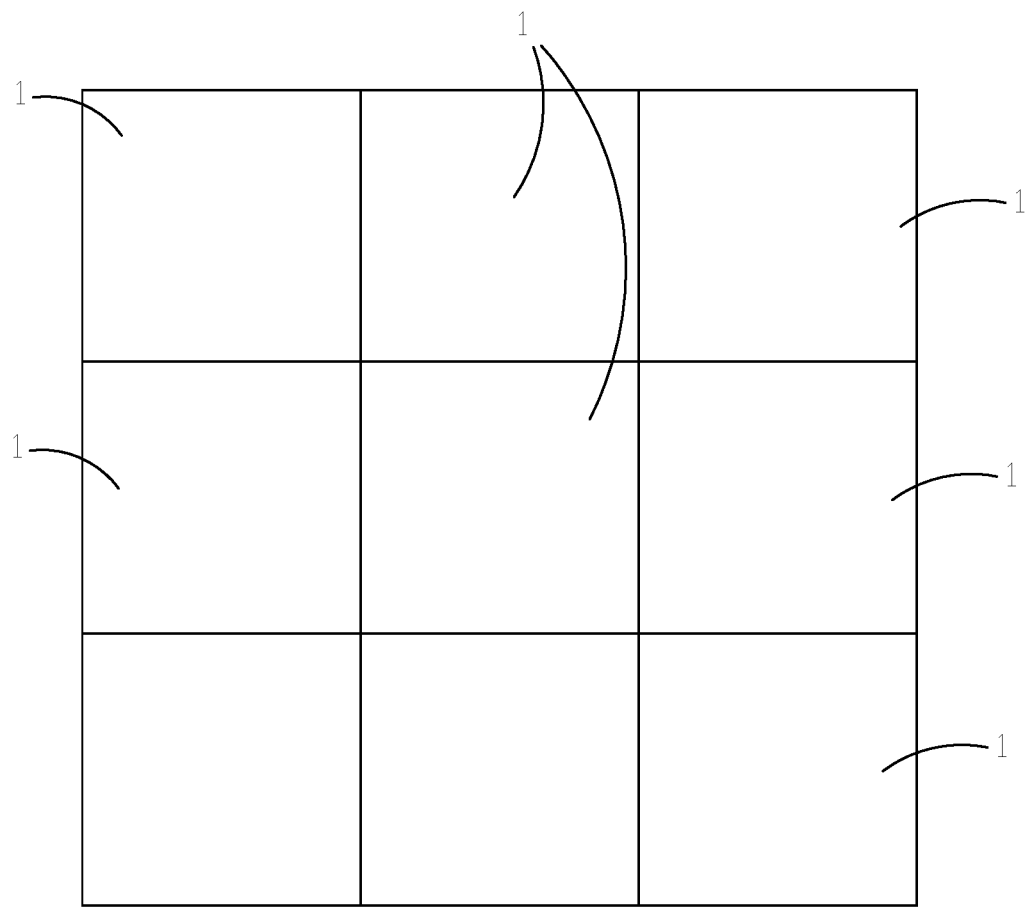
FIG. 1 is a schematic view of a conventional technology assembling a plurality of small LED displays to form a large display screen.
Figure 2:
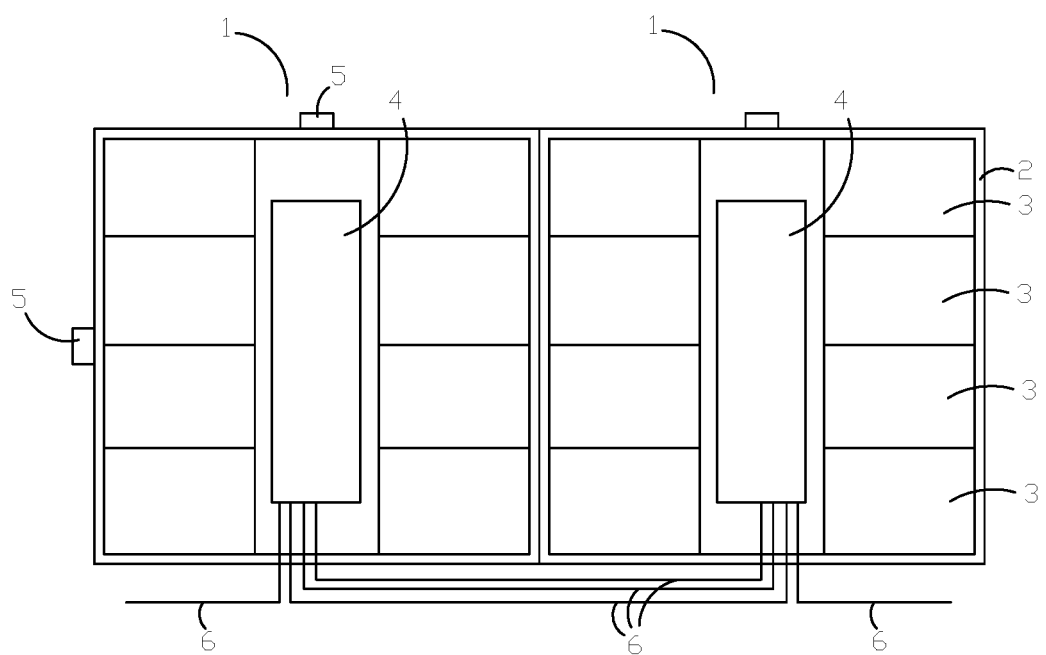
FIG. 2 is a schematic view of the back side of a small-sized LED display panel in the conventional art.
Figure 3:
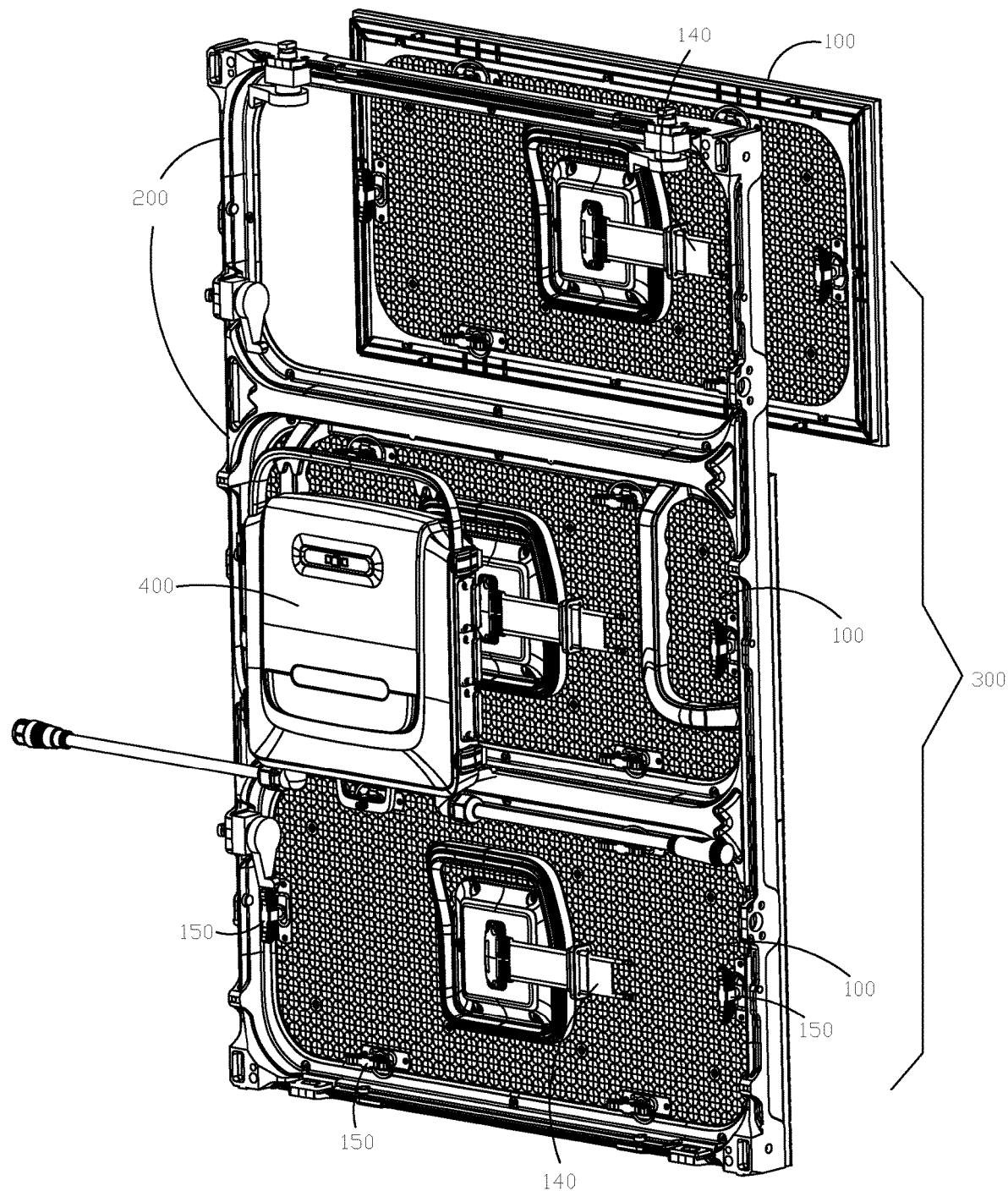
FIG. 3 is a perspective view of a module screen of the present invention.

As shown in FIG. 3, a unit screen lead-out cable 140 is disposed on the back of the plate bottom plate 110, and the unit screen lead-out cable 140 is connected to the LED light board 120. The unit screen lead-out cable 140 is integrated with power cords and signal lines.

The unit screen lead-out cable 140 supply power for the LED light board 120, and simultaneously transmits various signals, such as control signals, data signals, etc., to the LED light board 120.

In a specific implementation, the LED light board 120 can be formed by splicing a plurality of LED light boards.

Figure 5:
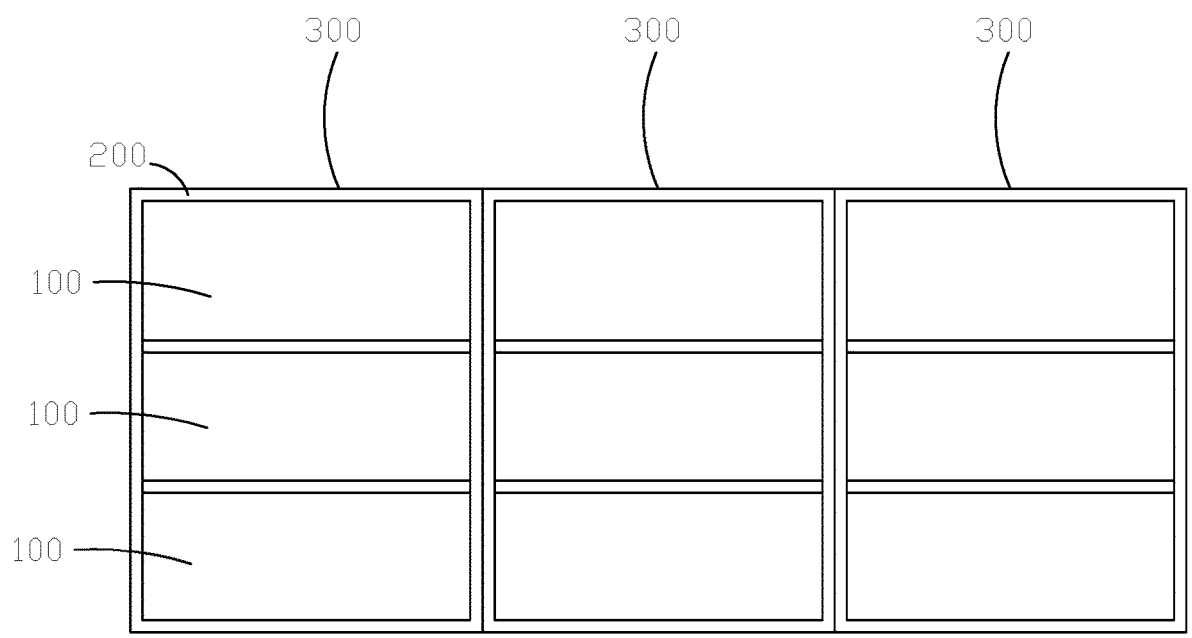
FIG. 5 is a schematic view showing the horizontal assembly of the module screen of the present invention to form a large display screen.

As shown in FIGS. 3 and 5, a specific number of the unit screens 100 are assembled in a splicing frame 200 to form a module screen 300.

For example, three unit screens 100 are vertically spliced together to form the module screen 300.

In an embodiment, each of the unit screens 100 is provided with a fixed lock 150, by which the unit screen 100 can be fixed on the splicing frame 200.

As shown in FIG. 5, a plurality of the module screens 300 are horizontally spliced to form a large display screen, and the large display screen is powered to emit and externally display text, images, videos and the like.

Figure 6:
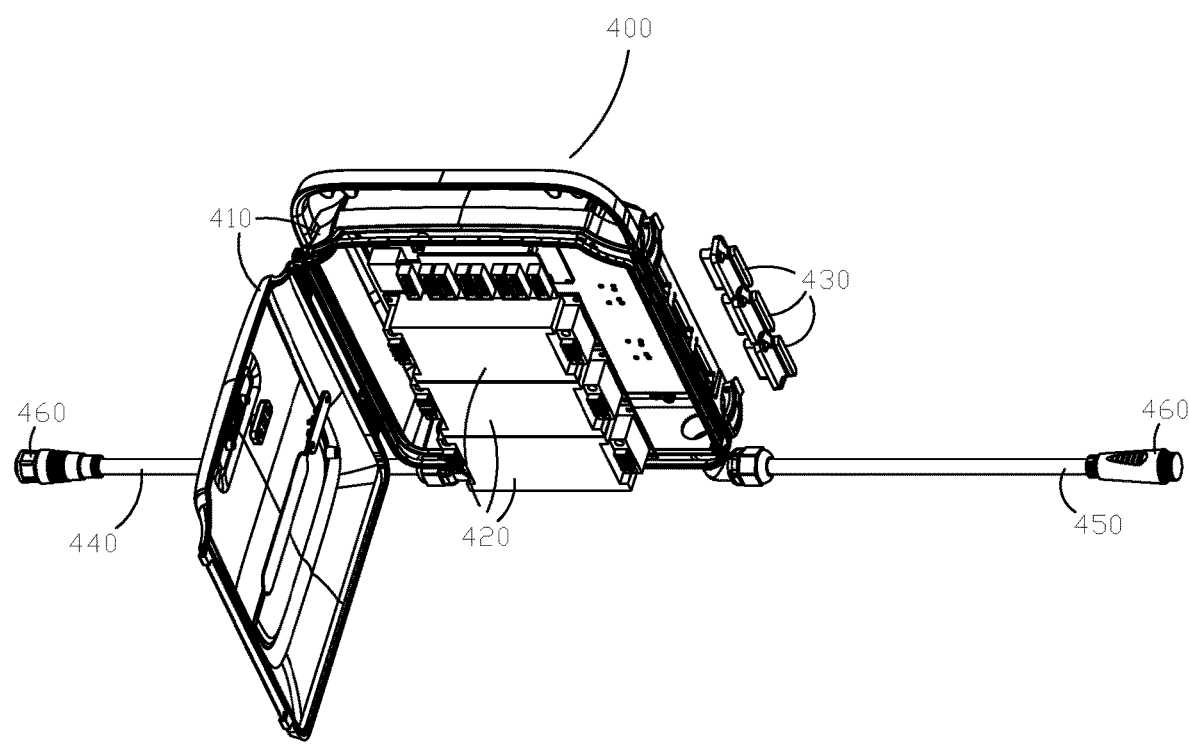
FIG. 6 is a perspective view of a collective power supply box of the present invention.

As shown in FIGS. 3 and 6, the module screen 300 includes a collective power box 400 which is fixed on the back of the unit screen 100 which constitutes the module screen 300.

As shown in FIG. 6, the collective power box 400 includes a box 410, a plurality of component modules 420, a plurality of connection sockets 430, a lead-in cable 440, and a lead-out cable 450, wherein the component modules 420 are simultaneously disposed in the box 410, the number of the component modules 420 is equal to the number of the unit screens 100. For example, if the module screen 300 is assembled by three cell screens 100, three component modules 420 are disposed in the box 410.

The component module 420 has a one-to-one correspondence with the unit screen 100 constituting the module screen 300.

The component module 420 includes a power control module and a signal control module.

Figure 7:
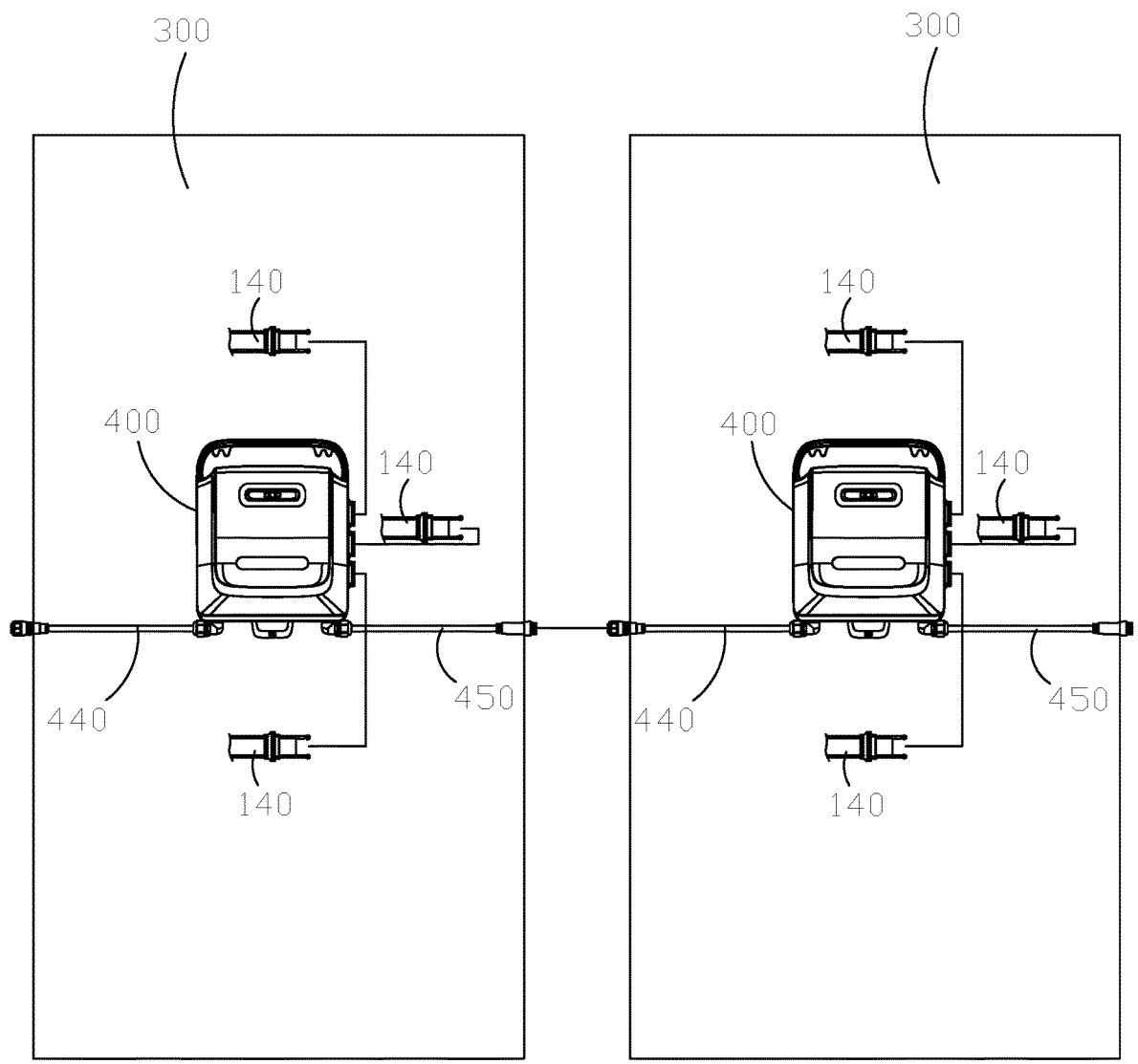
FIG. 7 is a schematic view showing the connection of two module screens of the present invention.

A plurality of the connection sockets 430 are disposed on the box 410. The number of the connection sockets 430 is equal to the number of the unit screens 100. For example, if the module screen 300 is assembled by three cell screens 100, three connection sockets 430 are disposed on the box 410. The connection socket 430 has a one-to-one correspondence with the lead-out line 140 of the unit screen 100 constituting the module screen 300. As shown in FIG. 7, the lead-out cable 140 of the unit screen 100 constituting the module screen 300 is correspondingly inserted into the connection socket 430.

The lead-in cable 440 and the lead-out cable 450 are connected to both sides of the box 410.

As shown in FIGS. 5 and 7, when a plurality of the module screens 300 are horizontally assembled to form the large display screen, the lead-in cable 440 and the lead-out cable 450 are connected between different module screens 300.

The collective power boxes 400 of the different module screens 300 are connected together by the lead-in cable 440 and the lead-out cable 450. Both the lead-in cable 440 and the lead-out cable 450 are integrated with a power line and a signal line.

In the specific implementation, the ends of the lead-in cable 440 and the lead-out cable 450 are provided with a plug 460 for convenient connection. Specifically, when a plurality of the module screens 300 are horizontally assembled to form a large display screen, the lead-out cable 450 of a module screen 300 is connected with the lead-in cable 440 of another module screen 300, such that the collective power box 400 of different module screens 300 is connected together.

Firstly, a plurality of the unit screens 100 of the same structural are assembled and form a module screen 300, and then a plurality of the module screens 300 are assembled side by side to form a large-sized display screen. The overall assembly method is simple and easy to assemble and disassemble.

In addition, the present invention collectively sets the power control module and the signal control module of the plurality of unit screens 100 constituting the module screen 300 in the collective power supply box 400, which can greatly simplify the single unit screen 100, and realizes centralized setting of circuits and electronic components, and concentrates on heat dissipation processing.

Finally, the present invention connects the different power supply boxes 400 of the module screen 300 by the lead-in cable 440 and the lead-out cable 450, which can greatly simplify the connection structure and greatly reduce the difficulty of assembling the connection.

As shown in FIG. 8 to FIG. 11, in the specific implementation, the splicing frame 200 is a curved splicing frame 510.

Figure 9:
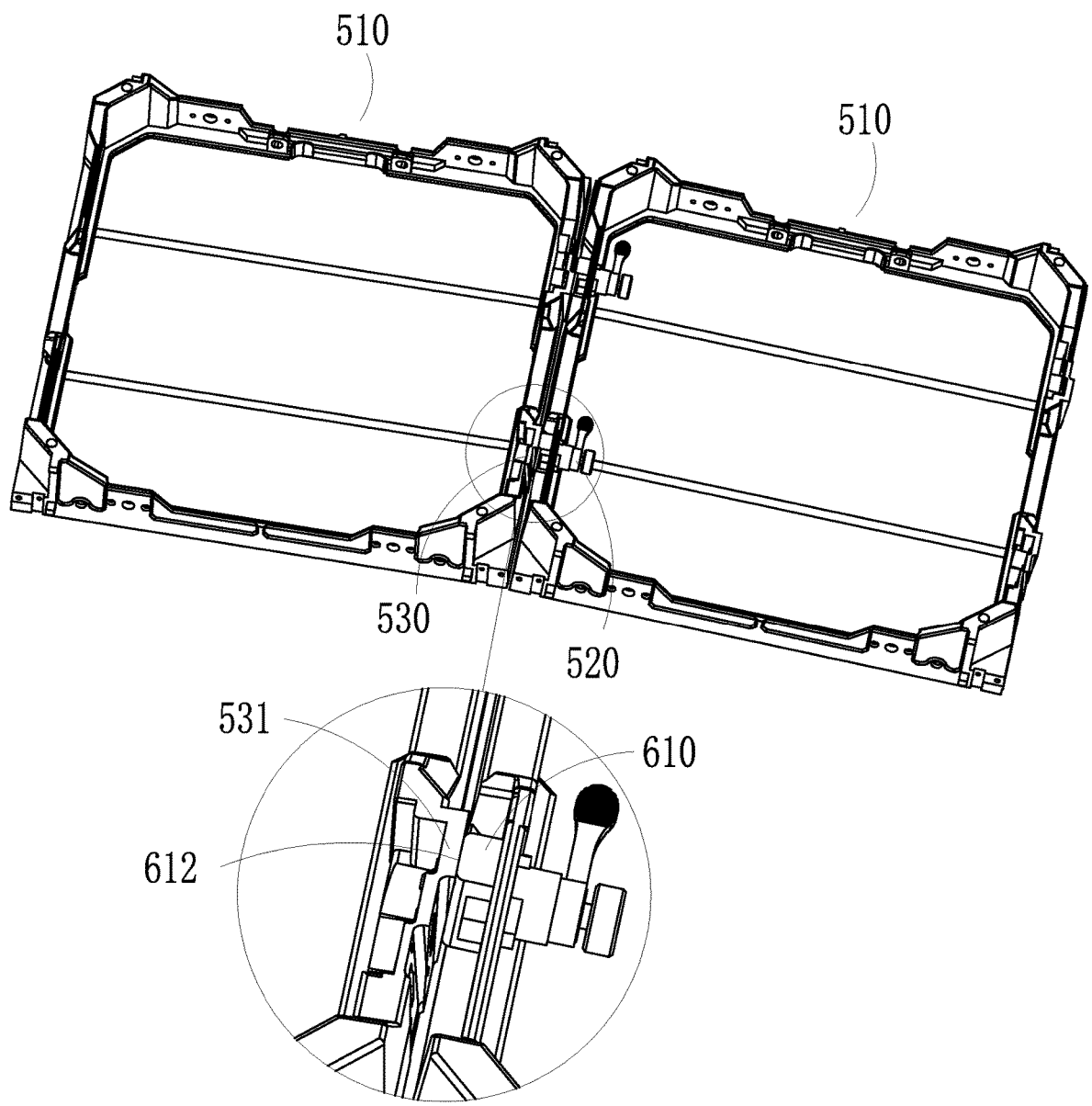
FIG. 9 is a schematic view showing the splicing of two curved splicing frames of the present invention.

As shown in FIG. 9, a sliding lock unit 520 is disposed on one side of the curved splicing frame 510, and a splicing gear unit 530 is disposed on the other side of the curved splice frame 510 with respect to the sliding lock unit 520.

Figure 10:
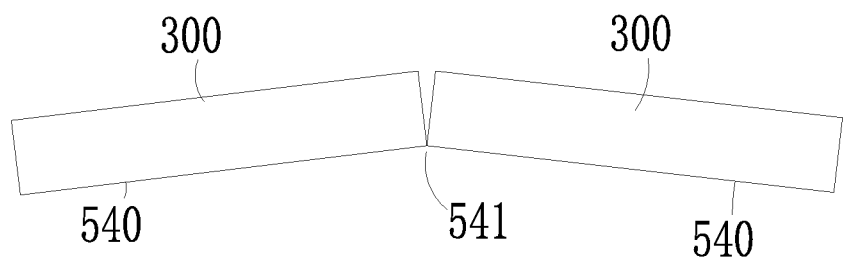
FIG. 10 is a schematic view splicing the module screens of the present to form a curved display screen.

The sliding lock unit 520 of the curved splicing frame 510 of a module screen 300 is locked in the splicing gear unit 530 of the curved splicing frame 510 of another module screen 300, so that two adjacent module screens 300 are spliced together, at the same time, as shown in FIG. 10, an angle 541 is formed between the front display surfaces 540 of the two module screens 300, and the angle 541 is greater than 135° and less than 180°.

When a plurality of the module screens 300 are assembled to each other, a large curved LED display screen can be formed.

Figure 8:
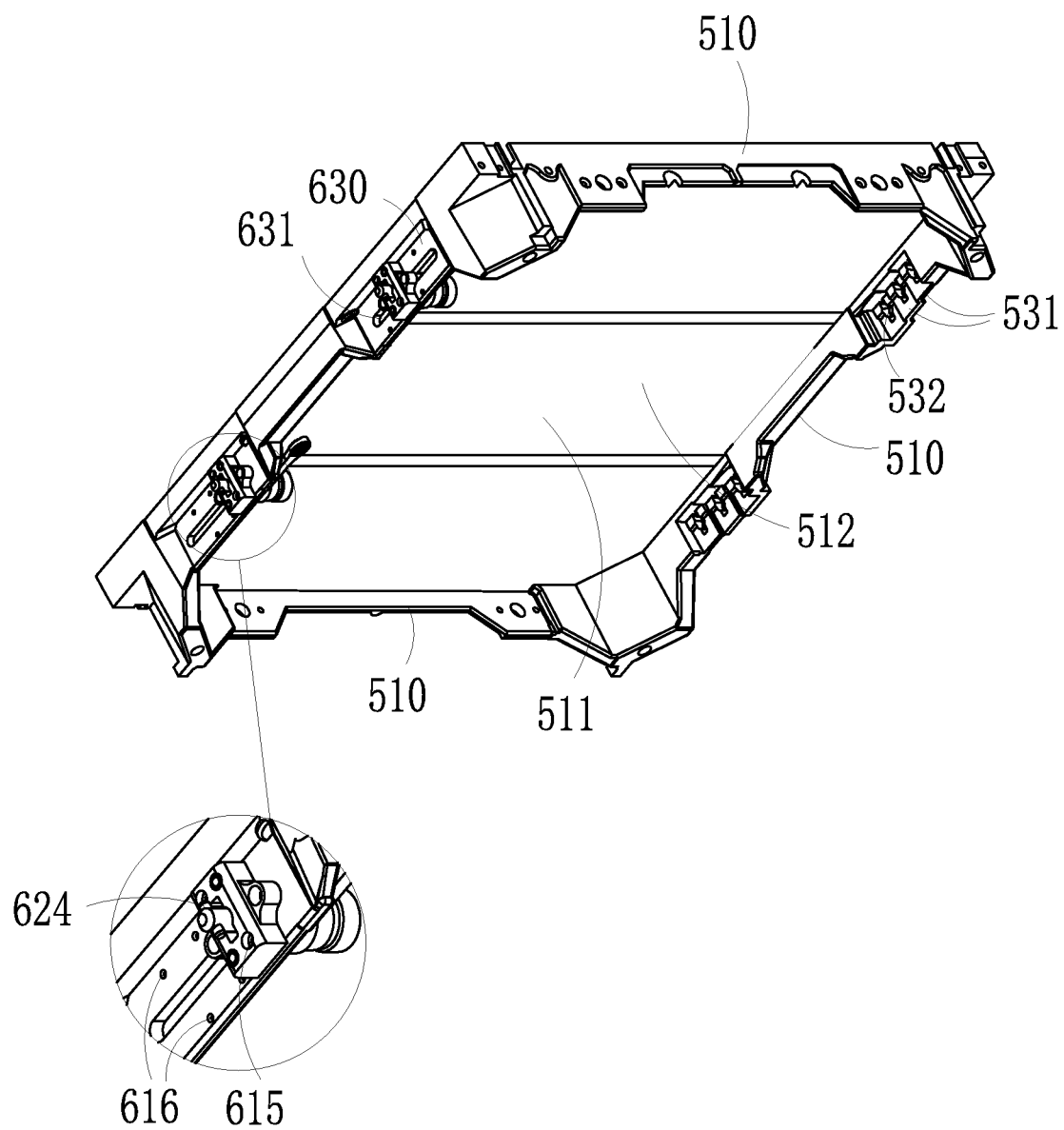
FIG. 8 is a perspective view of a curved splicing frame of the present invention.
Figure 11:
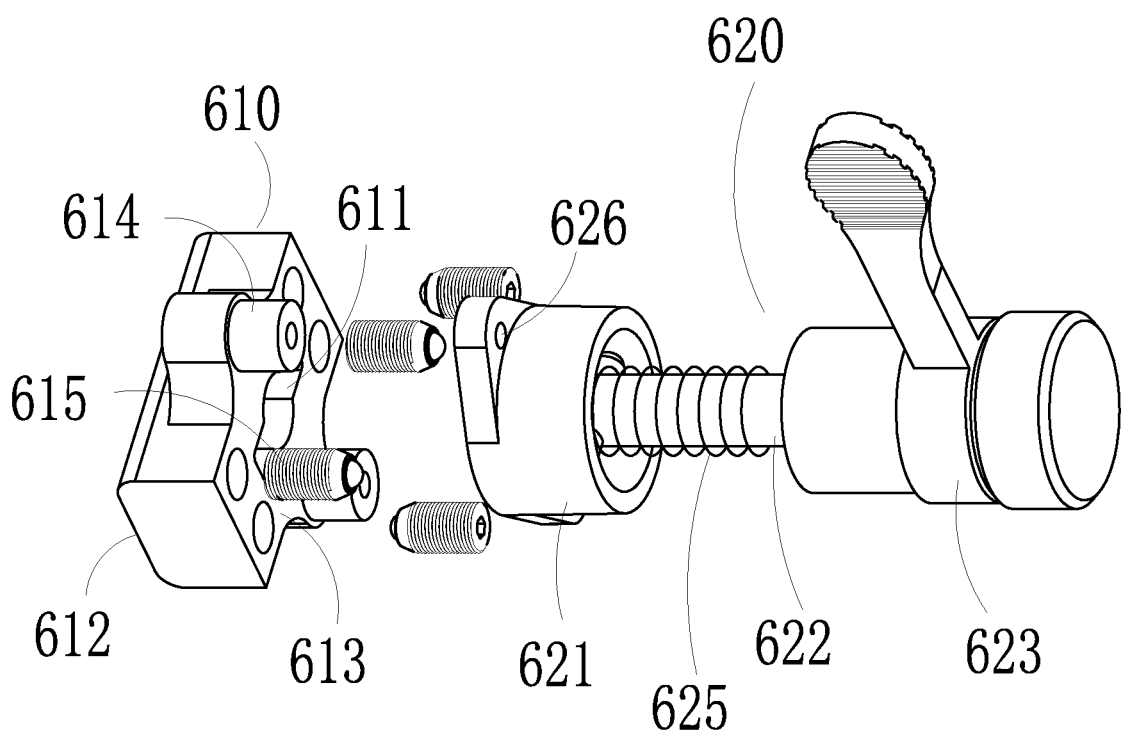
FIG. 11 is a perspective view of the sliding lock unit of the present invention.

As shown in FIG. 8 and FIG. 11, the sliding lock unit 520 includes a slide block 610 and a slide lock 620. As shown in FIG. 8, a slide plate 630 is disposed on the curved splicing frame 510, and the slide plate 630 is provided with a slide slot 631. The sliding lock unit 520 is slideably disposed on the slide plate 630, and the slide plate 630 is clamped between the slide block 610 and the slide lock 620.

As shown in FIG. 11, the slide lock 620 includes a clamping seat 621, a locking rod 622 and a rotating head 623, wherein the rotating head 623 is connected to the top of the locking rod 622, and the locking rod 622 is disposed at the clamping seat 621, as shown in FIG. 8, the bottom of the locking rod 622 is provided with a lever 624.

As shown in FIG. 11, in the specific implementation, the locking rod 622 is sleeved with a spring 625, and the spring 625 is located between the clamping seat 621 and the rotating head 623.

As shown in FIG. 11, the slide block 610 has a perforation 611, a pressing surface 612, and a clamping surface 613. The pressing surface 612 is located at the bottom of the slide block 610, and the clamping surface 613 is located at the top of the slide block 610. The perforation 611 is disposed between the pressing surface 612 and the clamping surface 613.

As shown in FIG. 8, the slide plate 630 is interposed between the bottom surface of the clamping seat 621 of the slide lock 620 and the clamping surface 613 of the slide block 610.

The locking rod 622 of the slide lock 620 is disposed in the sliding slot 631 of the slide plate 630, and the lever 624 of the locking rod 622 passes through the perforation 611 of the slide block 610.

As shown in FIG. 11, in a specific implementation, a fixing hole 626 is disposed on both sides of the clamping seat 621 of the slide lock 620, and a fixing table 614 is disposed on both sides of the slide block 626 corresponding to the fixing hole 626. A fixing screw is disposed in the fixing table 614, and the fixing screw is screwed into the fixing hole 626 to fix the slide plate 630 between the slide block 610 and the slide lock 620.

As shown in FIG. 8 and FIG. 11, in the specific implementation, a positioning screw 615 is screwed into the slide block 610, and a positioning hole 616 is disposed on the slide plate 630 corresponding to the positioning screw 615, and the positioning screw 615 can be inserted into the positioning hole 616 to fix the relative position between the slide block 610 and the slide plate 630.

As shown in FIGS. 8 and 9, the splicing gear unit 530 includes a plurality of gear plates 531, each of which has a gear plate perforation 532, the gear plate perforation 532 is corresponding to the perforation of the slide block 610. In the specific implementation, the different gear plates 531 have different inclination angles, and a plurality of the gear plates 531 are connected to each other to form a splicing gear unit 530.

As shown in FIG. 9, when the present invention is used, first, adjusting and sliding the sliding lock unit 520 along the sliding slot 631, so that the sliding lock unit 520 is aligned with one of the gear plate 531 of the splicing gear unit 530. Correspondingly, rotating the rotating head 623 of the sliding lock 620, so that the lever 624 of the locking rod 622 passes through the gear plate perforation 532 of the gear plates 531, and then rotating the locking rod 622 to lock the lever 624 on the back of the gear plate 531 to fix the relative position between the sliding lock unit 520 and the splicing gear unit 530. At this moment, the pressing surface 612 of the slide block 610 is pressed against the front side of the gear plate 531.

As shown in FIG. 10, because the gear plate 531 has an inclined angle, when the sliding lock unit 520 of the module screen 300 is locked in the other gear unit 530 of the module screen 300, an angle 541 can be formed between the front display surfaces 540 of the two module screen 300. When a plurality of the module screens 300 are assembled to each other, a large curved LED display screen can be formed.

What is claimed is:

1. A modularized spliced LED display screen comprising a plurality of unit screens (100), each of the unit screens (100) comprises a plate bottom plate (110), an LED light board (120) and a mask (130), wherein,
   the plate bottom plate (110), the LED light board (120) and the mask (130) are all plate-shaped, and the LED light board (120) is fixed on the plate bottom plate (110), and the mask (130) is covered In front of the LED light board (120), the unit screen (100) is generally flat, and a unit screen lead-out cable (140) is disposed on the back of the plate bottom plate (110), and the lead-out cable (140) is connected with the LED light board (120),
   a certain number of the unit screens (100) are assembled in a splicing frame (200) to form a module screen (300), and a plurality of the module screens (300) are horizontally assembled to form a large display screen,
   the module screen (300) comprises a collective power box (400), and the collective power box (400) is fixedly disposed on the back of the unit screen (100) constituting the module screen (300),
   the collective power box (400) comprises a box (410), a plurality of component modules (420), a plurality of connection sockets (430), a lead-in cable (440) and a lead-out cable (450), wherein the plurality of component modules (420) simultaneously disposed in the box (410), the number of the component modules (420) is equal to the number of the unit screens (100) constituting the module screen (300), and the component module (420) has a one-to-one correspondence with the unit screen (100) constituting the module screen (300),
   a plurality of the connection sockets (430) are disposed on the box (410), and the number of the connection sockets (430) is equal to the number of the unit screens (100) constituting the module screen (300), and the connection socket (430) has a one-to-one correspondence with the lead-out line (140) of the unit screen (100) constituting the module screen (300), the lead-out cable (140) of the unit screen (100) constituting the module screen (300) is correspondingly inserted into the connection socket (430),
   the lead-in cable (440) and the lead-out cable (450) are connected on both sides of the box (410),
   when a plurality of the module screens (300) are horizontally assembled to form the large display screen, the lead-in cable (440) and the lead-out cable (450) are connected between different module screens (300), and then the collective power boxes (400) of the different module screens (300) are connected together by the lead-in cable (440) and the lead-out cable (450), when a plurality of the module screens (300) are horizontally assembled to form a large display screen, the lead-out cable (450) of a module screen (300) is connected with the lead-in cable (440) of another module screen (300), such that the collective power box (400) of different module screens (300) is connected together.

2. A modularized spliced LED display screen according to claim 1, wherein the unit screen lead-out cable (140) is integrated with a power line and a signal line, and the component module (420) comprises a power control module and a signal control module, both the lead-in cable (440) and the lead-out cable (450) are integrated with a power line and a signal line.

3. A modularized spliced LED display screen according to claim 1, wherein each of the unit screens (100) is provided with a fixed lock (150) through which the unit screen (100) can be fixed on the splicing frame (200).

4. A modularized spliced LED display screen according to claim 1, wherein the ends of the lead-in cable (440) and the lead-out cable (450) are all provided with a plug (460).

5. A modularized spliced LED display screen according to claim 1, wherein the splicing frame (200) is a curved splicing frame (510), and a sliding lock (520) is arranged on one side of the curved splicing frame (510), a splicing gear unit (530) is provided on the other side of the curved splicing frame (510) with respect to the sliding lock unit (520),
   the sliding lock unit (520) of the curved splicing frame (510) of a module screen (300) is locked in the splicing gear unit (530) of the curved splicing frame (510) of another module screen (300), so that two adjacent module screens (300) are spliced together, at the same time, an angle (541) is formed between the front display surfaces (540) of the two module screens (300), when a plurality of the module screens (300) are assembled to each other, a large curved LED display screen can be formed.

6. A modularized spliced LED display screen according to claim 5, wherein the angle (541) is greater than 135° and less than 180°.

7. A modularized spliced LED display screen according to claim 5, wherein the sliding lock unit (520) comprises a slide block (610) and a slide lock (620), a slide plate (630) is disposed on the curved splicing frame (510), and the slide plate (630) is provided with a slide slot (631), the sliding lock unit (520) is slideably disposed on the slide plate (630), and the slide plate (630) is clamped between the slide block (610) and the slide lock (620), the slide lock (620) comprises a clamping seat (621), a locking rod (622) and a rotating head (623), wherein the rotating head (623) is connected to the top of the locking rod (622), and the locking rod (622) is disposed at the clamping seat (621), the bottom of the locking rod (622) is provided with a lever (624), the locking rod (622) is sleeved with a spring (625) located between the clamping seat (621) and the rotating head (623), the slide block (610) has a perforation (611), a pressing surface (612), and a clamping surface (613), the pressing surface (612) is located at the bottom of the slide block (610), and the clamping surface (613) is located at the top of the slide block (610), the perforation (61) is disposed between the pressing surface (612) and the clamping surface (613), the slide plate (630) is interposed between the bottom surface of the clamping seat (621) of the slide lock (620) and the clamping surface (613) of the slide block (610), the locking rod (622) of the slide lock (620) is disposed in the sliding slot (631) of the slide plate (630), and the lever (624) of the locking rod (622) passes through the perforation (611) of the slide block (610), the splicing gear unit (530) comprises a plurality of gear plates (531), each of which has a gear plate perforation (532) which is corresponding to the perforation (611) of the slide block (610), the different gear plates (531) have different inclination angles, and the gear plates (531) are connected to each other to form a splicing gear unit (530).

8. A modular spliced LED display screen according to claim 6, wherein a fixing hole (626) is disposed on both sides of the clamping seat (621) of the slide lock (620), and a fixing table (614) is disposed on both sides of the slide block (626) corresponding to the fixing hole (626), a fixing screw is disposed in the fixing table (614), and is screwed into the fixing hole (626) to fix the slide plate (630) between the slide block (610) and the slide lock (620).

9. The modular spliced LED display screen according to claim 6, wherein a positioning screw (615) is screwed into the slide block (610), and a positioning hole (616) is disposed on the slide plate (630) corresponding to the positioning screw (615), and the positioning screw (615) can be inserted into the positioning hole (616) to fix the relative position between the slide block (610) and the slide plate (630).

* * * * *